United States Patent
Monfray et al.

(10) Patent No.: US 10,823,986 B2
(45) Date of Patent: Nov. 3, 2020

(54) PHOTONIC DEVICES AND METHODS OF FABRICATION THEREOF

(71) Applicant: STMicroelectronics (Crolles 2) SAS, Crolles (FR)

(72) Inventors: Stephane Monfray, Eybens (FR); Frédéric Boeuf, Le Versoud (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 16/254,798

(22) Filed: Jan. 23, 2019

(65) Prior Publication Data
US 2019/0265519 A1 Aug. 29, 2019

(30) Foreign Application Priority Data
Feb. 23, 2018 (FR) ...................... 18 51612

(51) Int. Cl.
*G02F 1/035* (2006.01)
*G02F 1/025* (2006.01)
*H01L 29/66* (2006.01)

(52) U.S. Cl.
CPC ........ *G02F 1/025* (2013.01); *H01L 29/66136* (2013.01); *G02F 2201/063* (2013.01)

(58) Field of Classification Search
CPC ........ G02F 1/225; G02F 1/2257; G02F 1/025; G02F 1/2255; G02F 1/035
See application file for complete search history.

(56) References Cited

U.S. PATENT DOCUMENTS

| | | |
|---|---|---|
| 2011/0215344 A1 | 9/2011 | Dardy et al. |
| 2014/0199825 A1 | 7/2014 | Bian et al. |
| 2015/0270344 A1 | 9/2015 | Cheng et al. |
| 2016/0313577 A1* | 10/2016 | Sun .................. G02F 1/025 |
| 2017/0139239 A1 | 5/2017 | Li et al. |

FOREIGN PATENT DOCUMENTS

EP 3255480 A1 12/2017

OTHER PUBLICATIONS

Wagner, M et al., "Thermoelectric power generation using large-area Si/SiGe pn-junctions with varying Ge content," Semiconductor Science and Technology, Institute of Physics Publishing, GB, vol. 22, No. 1, Jan. 2007, DOI: 10.1088/0268-1242/22/1/S41, 4 pages.

* cited by examiner

*Primary Examiner* — Jennifer Doan
(74) *Attorney, Agent, or Firm* — Slater Matsil, LLP

(57) ABSTRACT

A photonic device includes a first region having a first doping type, and a second region having a second doping type, where the first region and the second region contact to form a vertical PN junction. The first region includes a silicon germanium (SiGe) region having a gradual germanium concentration.

18 Claims, 3 Drawing Sheets

PHOTONIC DEVICES AND METHODS OF FABRICATION THEREOF

CROSS-REFERENCE TO RELATED APPLICATIONS

This application claims the priority benefit of French Patent Application Number 18/51612, filed on Feb. 23, 2018, the content of which is hereby incorporated by reference in its entirety.

TECHNICAL FIELD

The present invention relates generally to semiconductor devices, and, in particular embodiments, to photonic devices and methods of fabrication thereof.

BACKGROUND

Optical fibers enable to transfer data in the form of light signals which are then converted into electric signals.

Each optical fiber is associated, upstream in the transmission direction, with a modulator and, downstream, with a photodiode. The modulator enables to modulate a characteristic of the light signal transmitted in the optical fiber so that it is representative of the data to be transmitted.

FIG. 1 schematically shows a modulator 10. Modulator 10 receives at a first input 12 a light signal supplied by a constant source. The modulator further comprises terminals 14 and 16 having a voltage V applied therebetween. In the example of FIG. 1, terminal 14 is coupled to a source of application of a potential V, and terminal 16 is coupled to ground. Modulator 10 supplies an output 18 with a light signal having its phase shift $\varphi(V)$ depending on voltage V.

Voltage V for example varies between a high value representing a logic value 1 and a low value representing a logic value 0. Voltage V, and thus the phase shift of light signal $\varphi(V)$, are then representative of data in binary format.

SUMMARY

In one embodiment, a photonic device includes a first region having a first doping type, the first region comprising a silicon germanium (SiGe) region having a gradual germanium concentration. The device further includes a second region having a second doping type, the first region and the second region contacting to form a vertical PN junction.

In an alternate embodiment, a photonic device comprises a first trench disposed in a first region of a substrate, where the first region has a first doping type. A second trench is disposed in a second region of a substrate, where the second region has a second doping type opposite to the first doping type. The second trench is parallel to the first trench. A ridge region is disposed between the first trench and the second trench, where the ridge region comprises a first portion of the first region and a second portion of the second region. A silicon germanium region is disposed in the first portion of the ridge region. The silicon germanium region comprises a germanium concentration that decreases from a top surface of the ridge region into the substrate, where the silicon germanium region contacts the second region to form a vertical PN junction.

In an alternate embodiment, a method of manufacturing a photonic device includes forming a first region having a first doping type over a substrate, and forming a second region having a second doping type over the substrate. The first region and the second region contact to form a vertical PN junction. The first region has a varying germanium concentration.

In an alternate embodiment, a method of manufacturing a photonic device includes depositing a mask layer over a substrate, forming an opening in the mask layer to expose a surface of the substrate, and epitaxially grow a silicon germanium block on the exposed surface through the opening. The method further includes diffusing the silicon germanium block to form a silicon germanium region comprising a varying germanium concentration, forming a first trench in a first region of the substrate, forming a second trench in a second region of the substrate, the second region contacting the silicon germanium region. The first trench is disposed against a sidewall of the silicon germanium region. The first region and the silicon germanium region are doped with a doping of a first doping type while the second region is doped with a doping of a second doping type.

DETAILED DESCRIPTION OF ILLUSTRATIVE EMBODIMENTS

Figure 1:
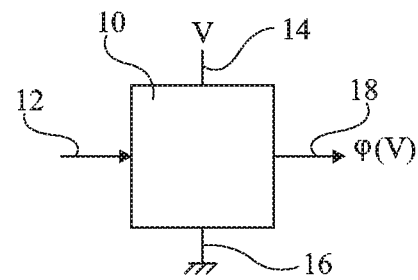
FIG. 1, previously described, is a simplified representation of a light signal modulator.

The present disclosure generally concerns the manufacturing of electronic components, and more particularly the forming of PN junctions. The present disclosure more particularly applies to PN junctions used in light signal modulators.

The same elements have been designated with the same reference numerals in the various drawings and, further, the various drawings are not to scale. For clarity, only those steps and elements which are useful to the understanding of the described embodiments have been shown and are detailed.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred to the orientation of the concerned elements in the drawings. Unless otherwise specified, expressions "approximately", "about", "substantially", and "in the order of" mean to within 10%, preferably to within 5%.

Unless otherwise specified, when reference is made to two elements connected together, this means that the elements are directly connected with no intermediate element other than conductors, and when reference is made to two elements coupled together, this means that the two elements may be directly coupled (connected) or coupled via one or a plurality of other elements.

An embodiment provides a PN junction comprising an area made of SiGe having a gradual germanium concentration.

According to an embodiment, the germanium concentration in the SiGe layer is decreasing from the upper surface.

According to an embodiment, the junction comprises a first region, of a first conductivity type, and a second region, of a second conductivity type, the SiGe area forming a portion of the first region.

According to an embodiment, the SiGe area is in contact with the second region.

According to an embodiment, the first conductivity type is type P and the second conductivity type is type N.

According to an embodiment, a lower portion of the first region is made of silicon of the first conductivity type.

According to an embodiment, the SiGe area is electrically coupled to a contacting area via a third silicon region of the first conductivity type.

Another embodiment provides a modulator comprising a PN junction such as previously described.

According to an embodiment, the modulator is a light signal modulator.

Another embodiment provides a method of manufacturing a PN junction comprising a SiGe area having a gradual germanium concentration.

According to an embodiment, the method comprises a SiGe condensation step.

According to an embodiment, the method comprises a step of epitaxial growth of a SiGe block on a silicon layer.

According to an embodiment, the SiGe block comprises between approximately 25 and approximately 45% of germanium.

According to an embodiment, the SiGe block has a thickness in the range from approximately 40 to approximately 200 nm.

Another embodiment provides a modulator manufacturing method comprising forming a PN junction such as previously described.

The foregoing and other features and advantages will be discussed in detail in the following non-limiting description of specific embodiments in connection with the accompanying drawings.

Figure 2:
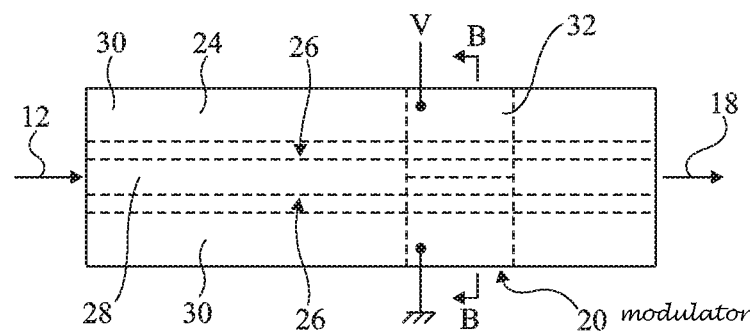
FIG. 2 is a top view of an example of a light signal modulator within a waveguide.
Figure 3:
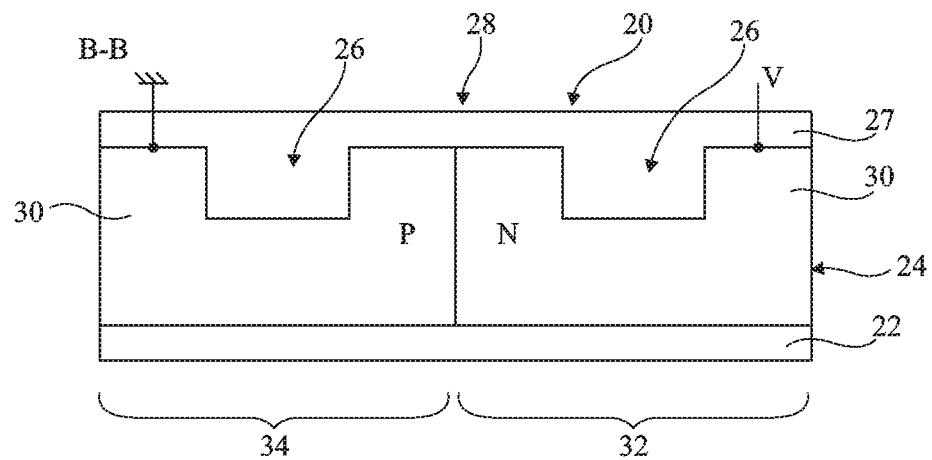
FIG. 3 is a simplified cross-section view along plane B-B of the converter of FIG. 2.

FIGS. 2 and 3 respectively are a top view of an example of a modulator 20 within a waveguide and a cross-section view along plane B-B of FIG. 2.

A substrate, not shown, for example, made of silicon, is covered with an insulator layer 22 (FIG. 3). Layer 22 is covered with a layer 24 of a semiconductor material, preferably made of silicon. Trenches 26 are formed in layer 24. Trenches 26 are filled with insulator. An insulator layer 27 (not shown in FIG. 2), preferably made of silicon oxide or of silicon nitride, covers layer 24.

A region 28 is horizontally delimited by trenches 26 and vertically delimited by layers 22 and 27. Each trench 26 is further located between region 28 and a region 30, located at the periphery of layer 24. The height of trenches 26 is smaller than the thickness of layer 24. Region 28 forms the region of the waveguide where the light signals propagate. One end of region 28 of the waveguide corresponds to input 12 and the other corresponds to output 18. The light signals thus propagate in region 28 from input 12 to output 18. The silicon is transparent for the considered wavelengths and the insulator of trenches 26 and of layers 22 and 27 is selected to have a refraction index sufficiently different from that of silicon to contain the light signal. For example, trenches 26 and layers 22 and 27 are made of silicon oxide, having a 1.45 refraction index, while that of silicon is 3.5.

Insulating trenches, not shown, are located at the level of the outer sides of regions 30. Such trenches reach layer 22 to individualize the modulator from other neighboring components.

A section of the waveguide, delimited by dotted lines in FIG. 2, forms modulator 20. This section comprises first and second regions 32 and 34 in contact with each other in region 28 and each comprising one of regions 30. Region 32 (at the top of FIG. 2 and on the right-hand side in FIG. 3) is N-type doped and is coupled by its region 30 to a source of application of a potential V. Region 34 (at the bottom of FIG. 2 and on the left-hand side of FIG. 3) is P-type doped and is coupled to ground. Thus, modulator 20 comprises a PN junction, forming the active area, on the path of the light signals propagating between input 12 and output 18.

The variation of phase shift φ(V) is obtained by varying the optical index of the silicon in the active area. Such an optical index variation is obtained by varying voltage V.

For example, in current technologies, the applied voltages are for example in the range from 0 V to 2.5 V for a phase-shift in the range from 10°/mm to 25°/mm.

It is desired to decrease the values of the voltages used to obtain same phase shift ranges.

Figure 4:
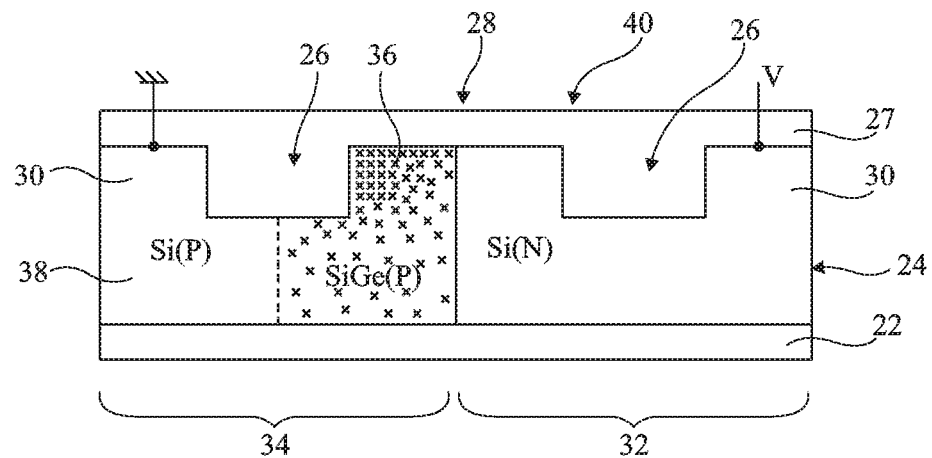
FIG. 4 is a cross-section view illustrating an embodiment of a light signal modulator.

FIG. 4 is a cross-section view illustrating an embodiment of a light signal modulator 40. Modulator 40 is located within a waveguide similar to that having modulator 20 located therein. Modulator 40 thus comprises, like modulator 20, insulator layer 22 located on the substrate, not shown, and layer 24 of semiconductor material, preferably made of silicon, on layer 22. The modulator further comprises trenches 26 delimiting regions 28 and 30. Region 32 (on the right-hand side in FIG. 4) is, as in FIG. 3, made of N-type doped silicon (Si(N)) and coupled by its region 30 to a source of application of a potential V. Region 34 comprises an area 36 made of silicon germanium (SiGe(P)), coupled to the contacting area and to ground by a P-type doped silicon region 38 (Si(P)). The contacting areas for example comprise contact pads, not shown, on regions 30, vias, not shown, crossing layer 27 to reach the pads.

The doping of region 32 is in the range from approximately $10^{17}$ to approximately $5 \cdot 10^{19}$ cm$^{-3}$, region 30 being more heavily doped than the rest of region 32. The doping of region 38 is in the range from approximately $5 \cdot 10^{18}$ to approximately $5 \cdot 10^{19}$ cm$^{-3}$.

Area 36 corresponds to the portion of region 34 located on the path of the light signals and possibly a portion of region 34 located under trench 26. Area 36 is thus in contact with region 32. The contact area between regions 32 and 34, that is, between area 36 and region 32, substantially corresponds to a vertical plane.

The germanium concentration of area 36 is gradual. The concentration progressively varies between the upper portion of area 36 and its lower portion. The upper portion has a concentration greater than that of the lower portion. The lower portion may have a sufficiently low germanium concentration to consider that this lower portion comprises no germanium. The lower portion would then only comprise silicon.

The doping of region 36 is in the range from approximately $10^{17}$ to approximately $3 \cdot 10^{18}$ cm$^{-3}$.

The inventors have determined that, for a same range of voltages V applied between regions 30, the range of phase shifts corresponding to the embodiment of FIG. 4 is wider, for example, substantially twice as wide, than the phase shift range in the case of a structure such as that described in FIGS. 2 and 3. In other words, to obtain a given phase shift range, the voltages to be used are lower in the embodiment of FIG. 4 than in the example of FIGS. 2 and 3. More particularly, for a same range of applied voltages V, the quotient of the phase shift range to the loss range is for example substantially equal to 2.5 for a silicon PN junction, and for example substantially equal to 5.4 for a silicon and silicon-germanium PN junction.

Thus, an advantage of the embodiment of FIG. 4 over the example of FIGS. 2 and 3 is that it consumes less power to obtain the same light signal phase shifts.

It could have been chosen to form a silicon germanium layer, for example, P-type doped, on a silicon PN junction such as that of FIG. 3. However, the PN junction would then be L shaped and would be longer than in the case of a vertical junction such as that of FIG. 2. The capacitance of the junction would then be higher. Further, only a portion of the junction would be made of SiGe. With a higher capacitance, the speed of the component is degraded and its cut-off frequency is decreased.

FIGS. 5A to 5D are cross-section views illustrating manufacturing steps of the modulator of FIG. 4.

Figure 5A:
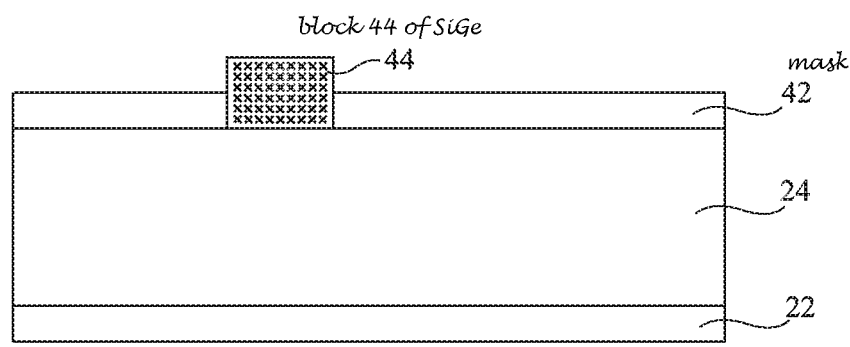
FIGS. 5A to 5D are cross-section views illustrating manufacturing steps of the modulator of FIG. 4.

FIG. 5A illustrates a manufacturing step during which insulator layer 22 is formed on the substrate, not shown. Layer 24 of semiconductor material, preferably made of silicon, is then formed on layer 22. Layer 24 for example has a thickness in the range from approximately 100 to approximately 400 nm. A mask 42 is then deposited on layer 24. Mask 42 is for example made of silicon nitride. Mask 42 comprises an opening facing at least a portion of the location where area 36 is desired to be formed.

A block 44 of SiGe is then formed by epitaxial growth on layer 24 in the opening of mask 42. SiGe block 44 for example has a thickness in the range from approximately 40 to approximately 200 nm, preferably from 40 to 60 nm, preferably 50 nm. Block 44 for example comprises a germanium concentration in the range from approximately 25 to approximately 45%, preferably in the range from 25 to 45%, preferably 35%.

The germanium concentration is here expressed by a percentage representing the number of germanium atoms relative to the number of silicon atoms.

Figure 5B:
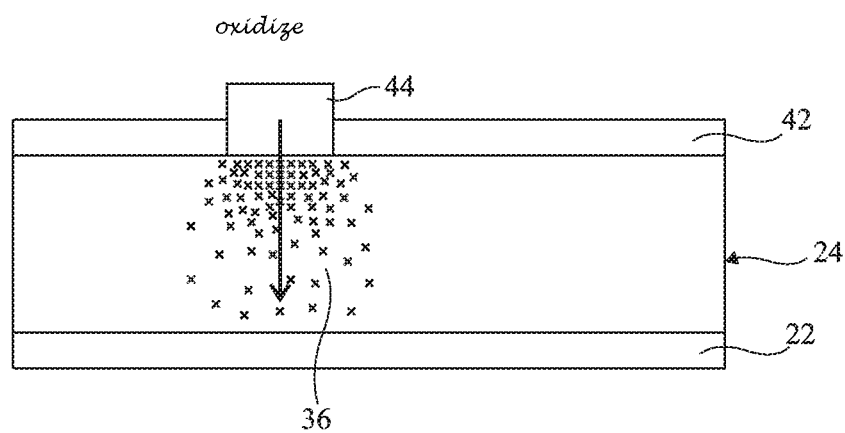

FIG. 5B illustrates a step of SiGe condensation. During this step, the structure shown in FIG. 5A is oxidized at a temperature sufficient for the germanium of block 44 to diffuse into layer 24 through the opening. The germanium concentration is thus gradual in layer 24 under block 44 and is higher in the area directly under block 44.

The germanium concentration in block 44 decreases along the condensation. Such a decrease depends on the duration of the condensation (anneal). If this duration is sufficient, the germanium concentration in block 44 may be sufficiently low to consider that the block is made of silicon oxide.

According to the temperature and the duration of the condensation, it is possible for the lower portion of layer 24 under block 44 to comprise no germanium.

The condensation temperature is for example in the range from approximately 700° C. to 1,100° C., preferably from 850° C. to 1,000° C. The duration of the condensation is for example in the range from 30 minutes to 6 hours.

Figure 5C:
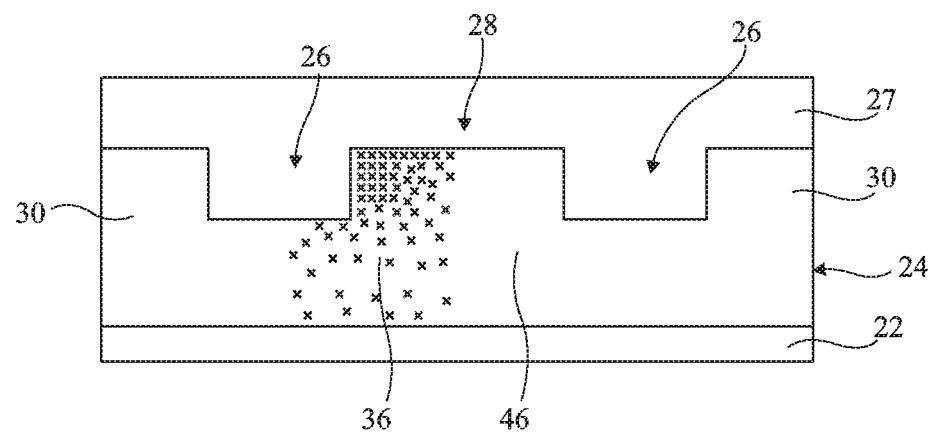

FIG. 5C illustrates another manufacturing step. During this step, block 44 and mask 42 are removed. Trenches 26 are then etched into layer 24. One of the trenches 26 may be partially formed in area 36. The other trench is formed so that region 28 located between trenches 26 comprises a germanium-free silicon portion 46 extending along the entire height of layer 24 and at least a portion of area 36. Trenches 26 are formed to be located between region 28 and regions 30.

Layer 24 is then covered with insulating layer 27.

Figure 5D:
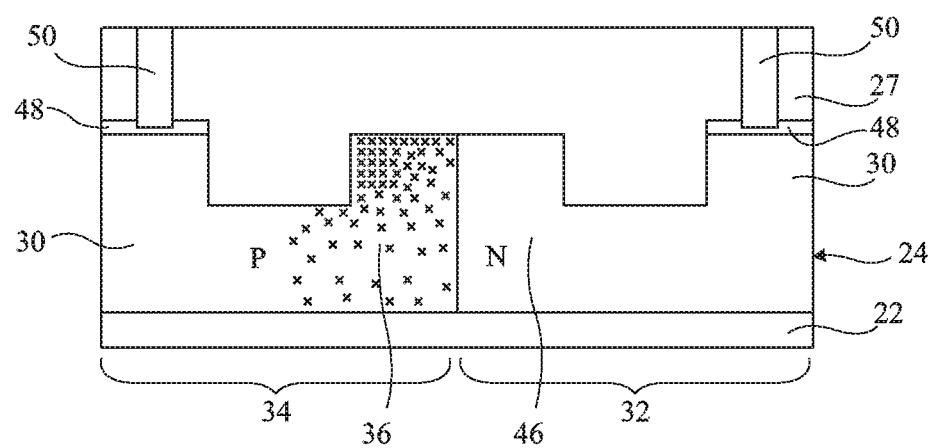

FIG. 5D illustrates another manufacturing step. During this step, region 34, formed of SiGe area 36 and of silicon region 38, is P-type doped and region 32, comprising, among others, portion 46, is N-type doped. The doping may be introduced with implantation.

Connection pads 48 are formed on regions 30 and vias 50 cross layer 27 to reach pads 48. It is thus possible to apply a voltage between regions 30 via vias 50 and pads 48.

Specific embodiments have been described. Various alterations, modifications, and improvements will readily occur to those skilled in the art. In particular, the P and N doping types may be inverted.

Further, it is possible for the contacting areas to all be connected to sources of application of voltages and for none of them to be grounded.

Various embodiments with different variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A photonic device comprising:
a first region having a first doping type, the first region comprising a silicon germanium (SiGe) region having a germanium content that varies within the SiGe region so that a first germanium concentration at a first position within the SiGe region proximate an upper surface of the SiGe region is different from a second germanium concentration at a second position within the SiGe region further from the upper surface than the first position; and
a second region having a second doping type, the first region and the second region contacting to form a vertical PN junction.

2. The device of claim 1, wherein the germanium concentration in the SiGe region is decreasing in a direction from the upper surface of the SiGe region extending into a substrate comprising the first and the second regions.

3. The device of claim 1, wherein the SiGe region is in contact with the second region.

4. The device of claim 1, wherein the first doping type is type P and the second doping type is type N.

5. The device of claim 1, wherein a lower portion of the first region is made essentially of silicon of the first doping type.

6. The device of claim 1, wherein the SiGe region is electrically coupled to a contacting area through a third silicon region of the first doping type.

7. The device of claim 1, wherein the photonic device is a light signal modulator.

8. A photonic device comprising:
a first trench disposed in a first region of a substrate, the first region having a first doping type;
a second trench disposed in a second region of a substrate, the second region having a second doping type opposite to the first doping type, the second trench being parallel to the first trench;

a ridge region disposed between the first trench and the second trench, the ridge region comprising a first portion of the first region and a second portion of the second region; and a silicon germanium region disposed in the first portion of the ridge region, wherein the silicon germanium region comprises a germanium concentration that decreases from a top surface of the ridge region into the substrate, the silicon germanium region contacting the second region to form a vertical PN junction.

9. The device of claim 8, wherein the silicon germanium region extends deeper into the first region than a bottom surface of the first trench.

10. The device of claim 8, further comprising an insulator layer covering the first trench and the second trench and extending between the first trench and the second trench.

11. The device of claim 10, further comprising:
a third region of the first doping type contacting the silicon germanium region.

12. The device of claim 11, further comprising:
a first via extending through the insulator layer and being coupled to the third region; and
a second via extending through the insulator layer and being coupled to the second region.

13. The device of claim 11, wherein the silicon germanium region extends under a first portion of the first trench and the third region extends under a remaining second portion of the first trench.

14. An photonic device comprising:
a first trench disposed in a first region of a substrate, the first region having a first doping type;
a second trench disposed in a second region of a substrate, the second region having a second doping type opposite to the first doping type, the second trench being parallel to the first trench;
a delimiting region disposed between the first trench and the second trench, a portion of the delimiting region comprising a first portion of the first region and a first portion of the second region;
a silicon germanium region disposed in the first portion of the first region, wherein the silicon germanium region comprises a varying germanium concentration, the silicon germanium region contacting the second region to form a PN junction, wherein the photonic device comprises an optical modulator; and
an insulator layer disposed in the first trench and the second trench, the insulator layer covering the delimiting region.

15. The device of claim 14, wherein the silicon germanium region extends deeper into the first region than a bottom surface of the first trench.

16. The device of claim 14, wherein the first region comprises a second portion of the first doping type contacting the silicon germanium region.

17. The device of claim 16, further comprising:
a first via extending through the insulator layer and being coupled to the second portion of the first region; and
a second via extending through the insulator layer and being coupled to the second region.

18. The device of claim 16, wherein the silicon germanium region extends under a first portion of the first trench and the second portion of the first region extends under a remaining second portion of the first trench.

* * * * *